United States Patent
Li et al.

(10) Patent No.: US 11,291,135 B2
(45) Date of Patent: Mar. 29, 2022

(54) SERVER AND CHASSIS OF SERVER

(71) Applicant: HONGFUJIN PRECISION ELECTRONICS(TIANJIN)CO.,LTD., Tianjin (CN)

(72) Inventors: Han-Yu Li, New Taipei (TW); Xiang-Hui Zeng, Tianjin (CN); Fan-Yin Meng, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/951,836

(22) Filed: Nov. 18, 2020

(65) Prior Publication Data
US 2022/0015257 A1 Jan. 13, 2022

(30) Foreign Application Priority Data
Jul. 13, 2020 (CN) .......................... 202010666940.X

(51) Int. Cl.
*H05K 7/14* (2006.01)
*G06F 1/26* (2006.01)
*G06F 1/18* (2006.01)
*H05K 7/20* (2006.01)

(52) U.S. Cl.
CPC ........... *H05K 7/1489* (2013.01); *G06F 1/187* (2013.01); *G06F 1/26* (2013.01); *H05K 7/20736* (2013.01)

(58) Field of Classification Search
CPC .................................................... H05K 7/1492
See application file for complete search history.

(56) References Cited

U.S. PATENT DOCUMENTS 9,706,678 B1 * 7/2017 Chen .................... H05K 7/1491
2015/0208543 A1 * 7/2015 Chen ....................... G06F 1/184
361/679.39

FOREIGN PATENT DOCUMENTS

TW 201806461 A 2/2018

* cited by examiner

*Primary Examiner* — Jerry Wu
(74) *Attorney, Agent, or Firm* — ScienBiziP, P.C.

(57) ABSTRACT

A chassis includes a receiving member, a bracket, and a sliding assembly. The bracket is configured to be mounted in a cabinet. The sliding assembly is configured to slidably mount the receiving member on the bracket.

8 Claims, 6 Drawing Sheets

SERVER AND CHASSIS OF SERVER

FIELD

The subject matter herein generally relates to a chassis, and more particularly to a server mounted with the chassis.

BACKGROUND

Due to the increasing demand for server data storage, a server may have a plurality of hard disks which occupy a lot of space. Thus, maintenance of the hard disks and backplanes may be inconvenient.

BRIEF DESCRIPTION OF THE DRAWINGS

Implementations of the present disclosure will now be described, by way of embodiments, with reference to the attached figures.

DETAILED DESCRIPTION

Figure 1:
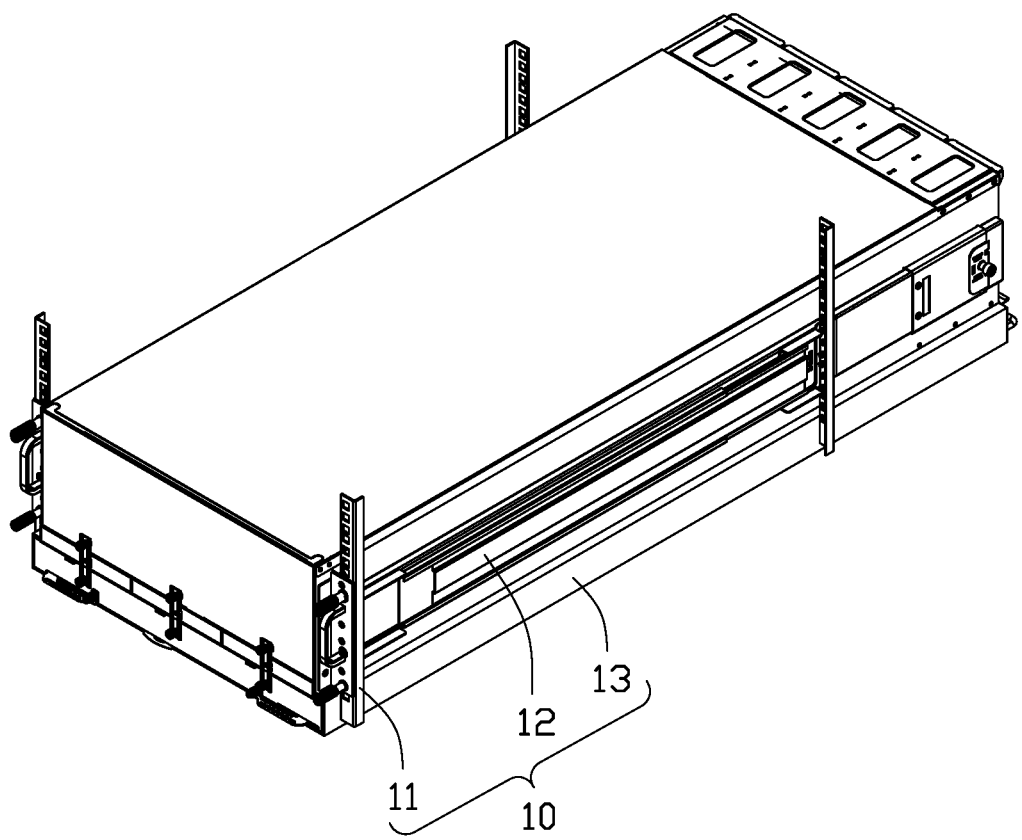
FIG. 1 is a perspective schematic diagram of a server according to an embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 2:
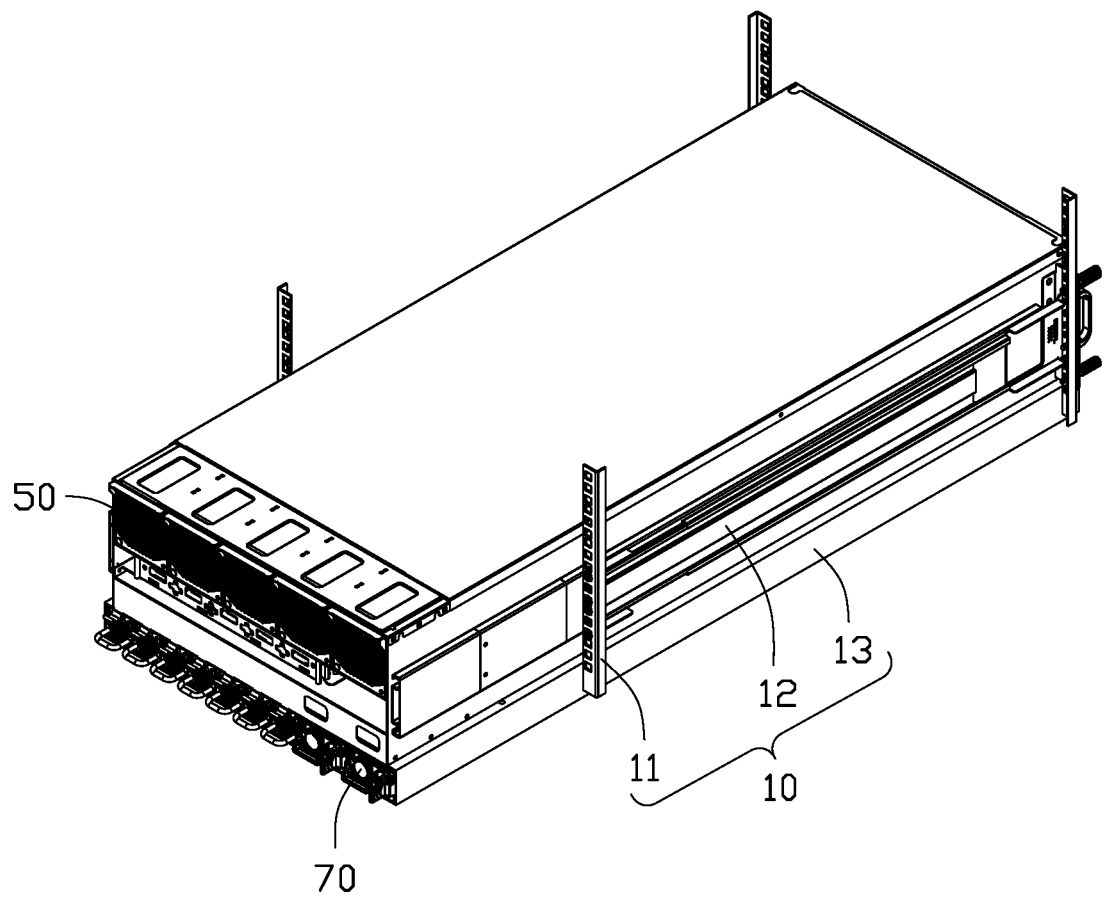
FIG. 2 is a perspective schematic diagram of the server of FIG. 1 from another angle.
Figure 3:
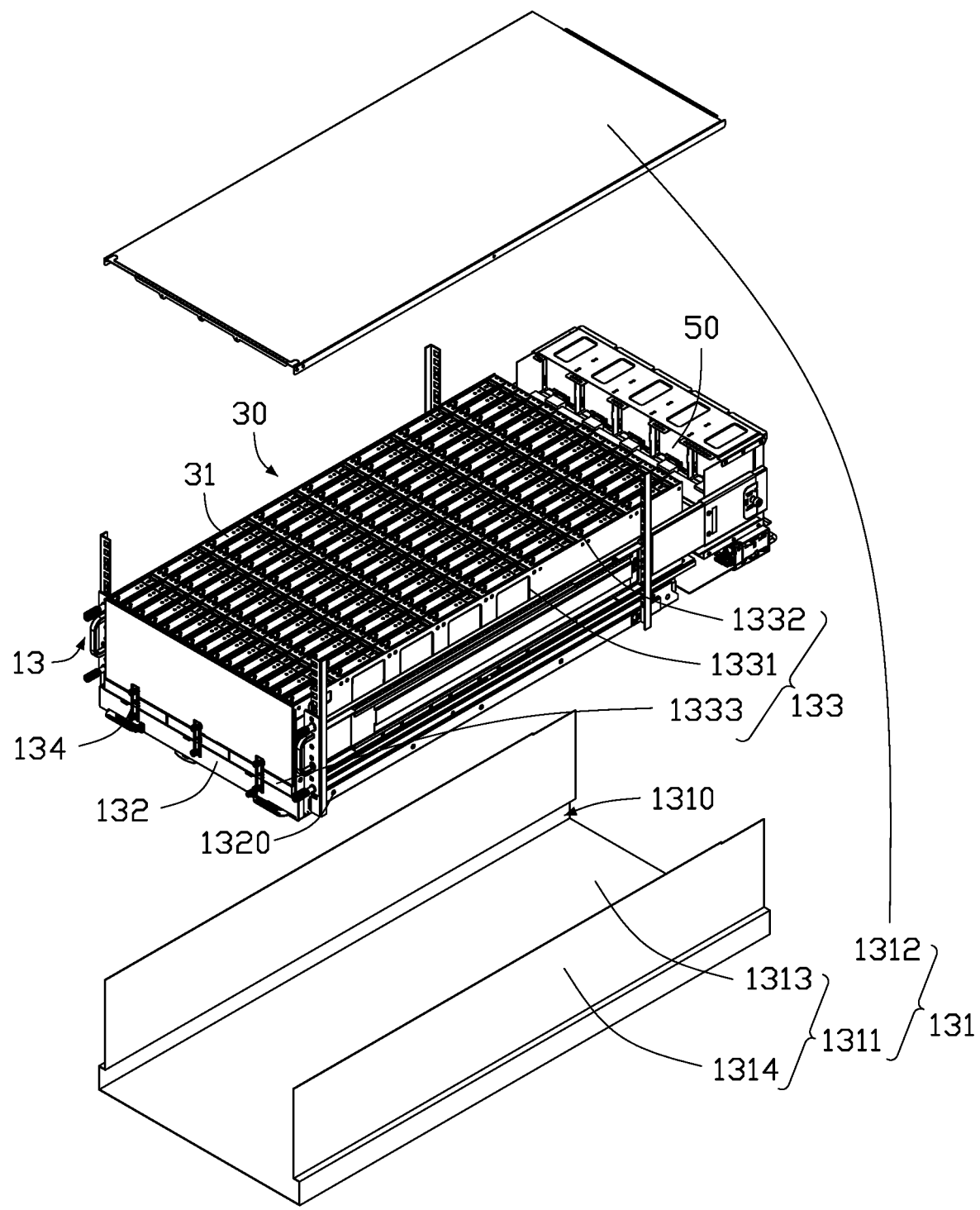
FIG. 3 is a partial exploded schematic diagram of the server shown in FIG. 1.

Referring to FIGS. 1-3, an embodiment of the present application provides a server 100. The server 100 includes a chassis 10, a hard disk assembly 30, a fan assembly 50, and a power supply assembly 70. The chassis 10 is used to house the hard disk assembly 30 and the fan assembly 50. The hard disk assembly 30 is used to store data. The hard disk assembly 30 includes a plurality of hard disks. The fan assembly 50 is used for blowing and dissipating heat of the hard disk assembly 30. The power supply assembly 70 is used to supply power to the hard disk assembly 30 and the fan assembly 50.

The chassis 10 includes a bracket 11, a sliding assembly 12, and a receiving member 13. The bracket 11 is installed in a cabinet. The receiving member 13 is slidably mounted on the bracket 11 through the sliding assembly 12.

In the illustrated embodiment, the number of the bracket 11 is four, and the number of the sliding assembly 12 is two. Two of the brackets 11 are respectively provided at two ends of each of the sliding assemblies 12. The two sliding assemblies 12 are respectively installed on opposite sides of the receiving member 13.

Figure 4:
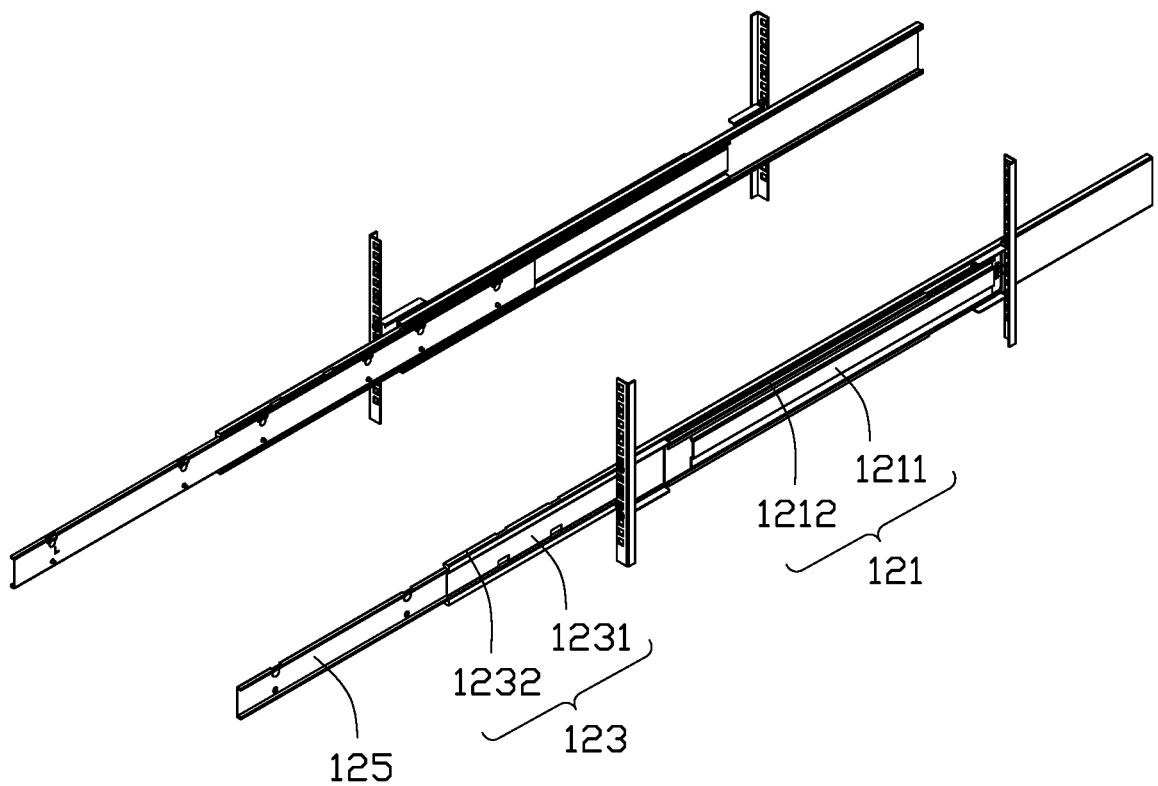
FIG. 4 is a perspective schematic diagram of a sliding assembly of the server.

Referring to FIG. 4, each sliding assembly 12 includes a first sliding member 121, a second sliding member 123, and a third sliding member 125. The first sliding member 121 is fixed to the bracket 11. The second sliding member 123 is slidably engaged with the first sliding member 121. The third sliding member 125 is slidably engaged with the second sliding member 123 and connected to the receiving member 13.

The receiving member 13 is moved out of the chassis 10 by extending the first sliding member 121, the second sliding member 123, and the third sliding member 125.

The first sliding member 121 includes a first body 1211 and two first latching portions 1212 provided on both sides of the first body 1211. The second sliding member 123 includes a second body 1231 and two second latching portions 1232 provided on both sides of the second body 1231. Each of the second latching portions 1232 is slidably engaged with a corresponding one of the first latching portions 1212, respectively. The two second latching portions 1232 respectively latch on two sides of the third sliding member 125. The third sliding member 125 can slide in a direction parallel to the second latching portions 1232.

Referring to FIG. 3, the receiving member 13 includes a main portion 131, a first receiving portion 132, and a second receiving portion 133. The main portion 131 is substantially a rectangular parallelepiped. The main portion 131 is connected to the second sliding member 123. The first receiving portion 132 and the second receiving portion 133 are stacked in the main portion 131. The second receiving portion 133 is located above the first receiving portion 132. The first receiving portion 132 and the second receiving portion 133 are each used for receiving part of the hard disk assembly 30. The fan assembly 50 and the power supply assembly 70 are received in the main portion 131 and are adjacent to the first receiving portion 132 and the second receiving portion 133.

The main portion 131 includes a base 1311 and a cover 1312. The base 1311 includes a first bottom plate 1313 and two first side plates 1314 respectively provided on opposite sides of the first bottom plate 1313. The cover 1312 is located on one end of the two first side plates 1314 away from the first bottom plate 1313. Each of the first side plates 1314 is connected to a corresponding second sliding member 123.

Figure 5:
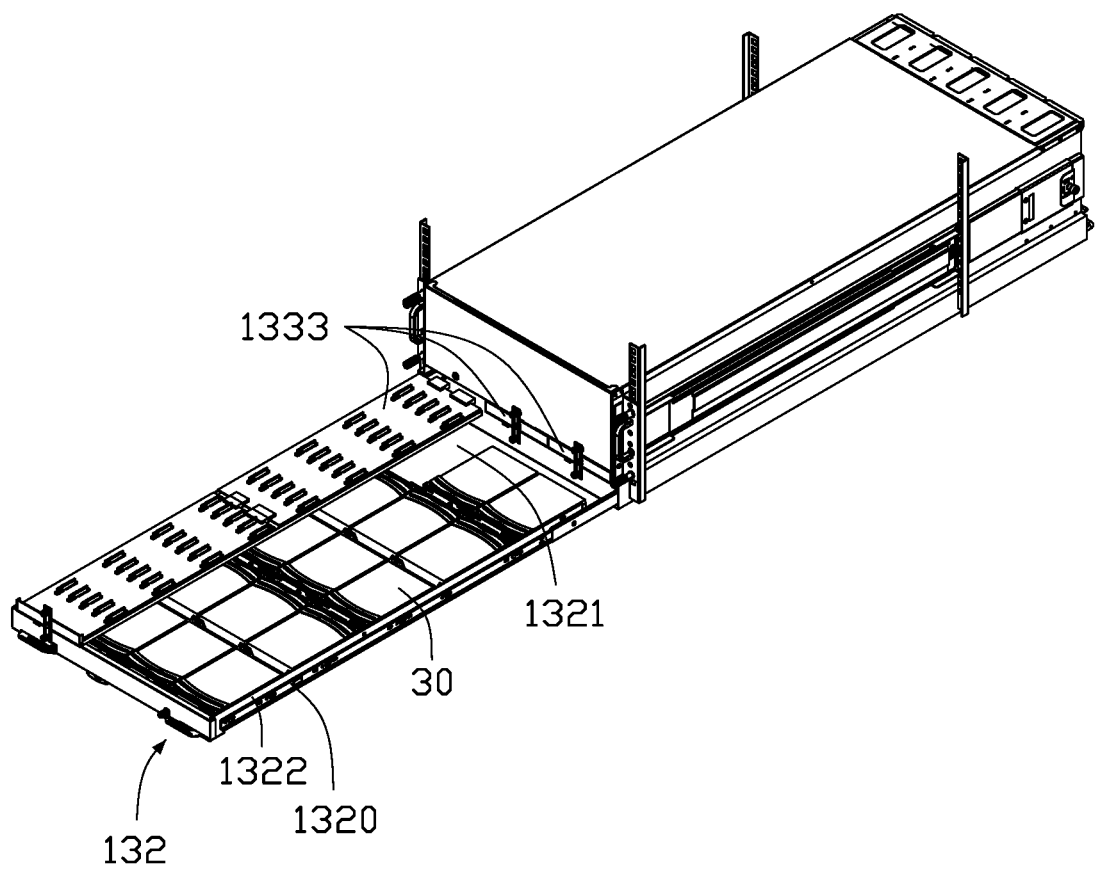
FIG. 5 is a perspective schematic diagram of a first receiving portion and second backplanes of the server being pulled out along with the first receiving part.
Figure 6:
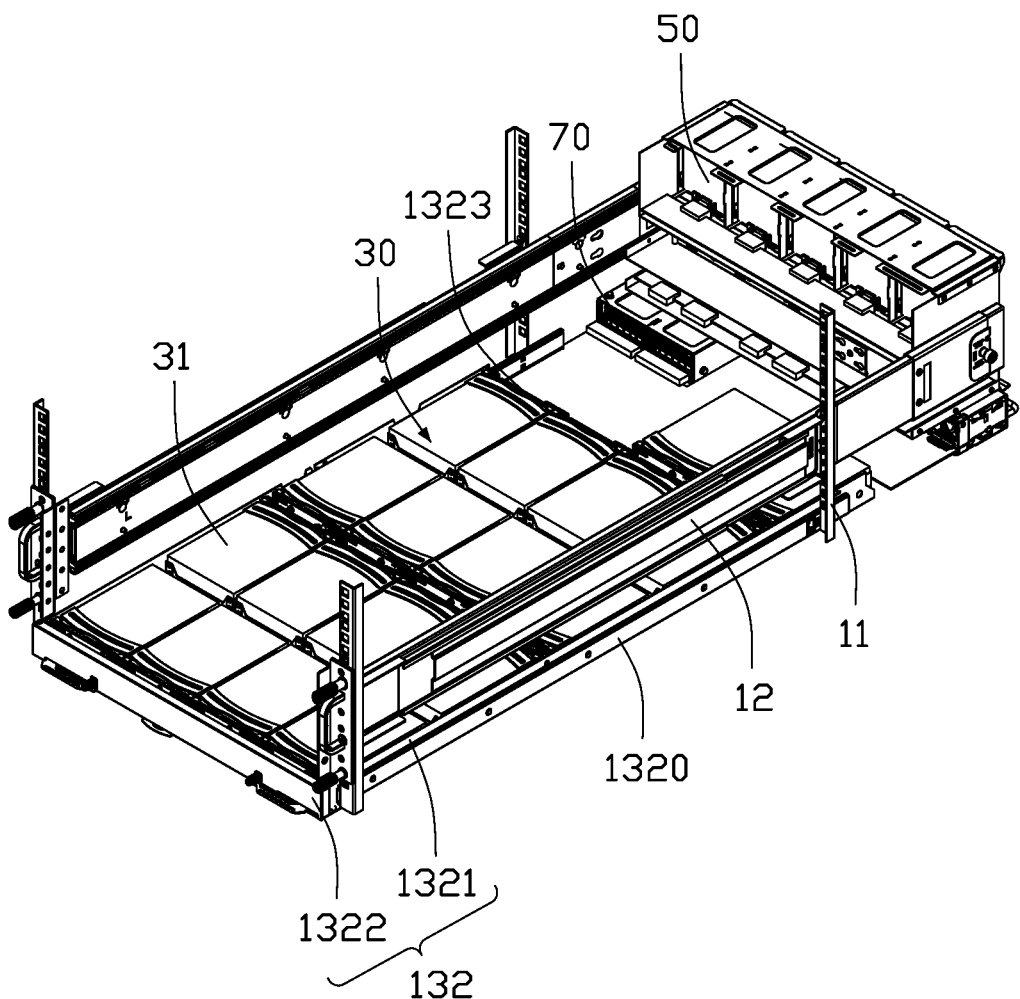
FIG. 6 is a perspective schematic diagram of the components of the server.

Referring to FIGS. 5 and 6, the first receiving portion 132 is slidably engaged with the main portion 131. The first receiving portion 132 includes a second bottom plate 1321 and three second side plates 1322 arranged on the second bottom plate 1321. A side of the first receiving portion 132 facing the fan assembly 50 and the power supply assembly 70 is not provided with a second side plate 1322 to facilitate ventilation and cable passage. The second bottom plate 1321 is provided with a clearance portion (not shown) to avoid the power supply assembly 70. The first receiving portion 132 can be pulled out in a direction away from the fan assembly 50 and the power supply assembly 70.

In the illustrated embodiment, each of the first side plates 1314 defines a sliding groove 1310. Each of the second side plates 1322 is provided with a protruding portion 1320 respectively. The protruding portions 1320 are respectively slidably engaged in the sliding grooves 1310 to limit a sliding direction of the first receiving portion 132.

A plurality of first backplanes 1323 is further arranged in the first receiving portion 132 at intervals. Each first backplane 1323 is used to connect multiple hard disks 31. In the illustrated embodiment, the hard disks 31 in the first receiving portion 132 are placed in a planar arrangement. The first receiving portion 132 has a 1U specification.

Referring to FIG. 3, the second receiving portion 133 includes four fixing plates 1331 and a plurality of mounting plates 1332. The four fixing plates 1331 are connected end-to-end to form a rectangular parallelepiped frame with two open ends. A plurality of mounting plates 1332 is arranged in the rectangular parallelepiped frame at intervals.

A plurality of second backplanes 1333 is provided in the second receiving portion 133. The second backplanes 1333 are located at an end of the second receiving portion 133 adjacent to the first receiving portion 132. That is, the second backplanes 1333 are located between the first receiving portion 132 and the plurality of mounting plates 1332.

The multiple hard disks 31 in the second receiving portion 133 are installed on the plurality of mounting plates 1332 and connected to the second backplanes 1333. In the illustrated embodiment, the number of the second backplane 1333 is three, and the three second backplanes 1333 are arranged closely together. It is understood that in other embodiments, the three second backplanes 1333 may be replaced with one integrated backplane or other numbers of backplanes. In the illustrated embodiment, the plurality of hard disks 31 in the second receiving portion 133 are arranged upright. The second receiving portion 133 has a 4U specification.

In the illustrated embodiment, the receiving member 13 further includes a fixing member 134. The fixing member 134 is used for fixedly connecting the first receiving portion 132 and the second receiving portion 133.

During operation and maintenance of the server 100, the receiving member 13 is pulled out of the cabinet. Then, by opening the cover 1312, the hard disks 31 in the second receiving portion 133 can be installed or removed. Then, the first receiving portion 132 can be pulled out, and the hard disks 31 in the first receiving portion 132 can be installed or removed. When any of the first backplanes 1323 need to be maintained, the first receiving portion 132 is pulled out and the corresponding hard disks 31 are removed to remove the corresponding first backplanes 1323. When any of the second backplanes 1333 need to be maintained, the cover 1312 is opened and the corresponding hard disks 31 are removed to cause the corresponding second backplanes 1333 to drop onto the hard disks 31 in the first receiving portion 132, and then the first receiving portion 132 is pulled out so that the corresponding second backplanes 1333 can be removed (see FIG. 5).

The receiving member 13 of the chassis 10 of the server 100 is installed on the bracket 11 through the sliding assembly 12. The receiving member 13 can slide relative to the bracket 11 to be pulled out or retracted, which is convenient for operation and maintenance.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A chassis comprising: a receiving member; a bracket configured to be mounted in a cabinet; and a sliding assembly configured to slidably mount the receiving member on the bracket; and the receiving member comprises a main portion, a first receiving portion, and a second receiving portion; the first receiving portion and the second receiving portion are stacked in the main portion; and each of the first receiving portion and the second receiving portion is configured to receive a corresponding plurality of hard disks; and the main portion comprises a base and a cover; the cover is covered on the base; the base comprises a first bottom plate and two first side plates respectively arranged on opposite sides of the first bottom plate; and the first receiving portion is slidably received in the main portion with a power supply assembly in front; the first receiving portion comprises a second bottom plate and a plurality of second side plates arranged on the second bottom plate; a plurality of first backplanes is arranged at intervals in the first receiving portion; each of the plurality of first backplanes mounts a first plurality of hard disks; and the second receiving portion is located above the first receiving portion; and each of the first side plates defines a sliding groove protruded outward; each of the second side plates comprises a protruding portion; and the protruding portions are respectively slidably received in the sliding grooves for limiting a sliding direction of the first receiving portion; and the second receiving portion comprises four fixing plates and a plurality of mounting plates; the four fixing plates are coupled together end-to-end to cooperatively form a frame structure open at two ends adjacent to a fan assembly; the plurality of mounting plates is arranged at intervals in the frame structure; and the plurality of mounting plates mounts a second plurality of hard disks.

2. The chassis of claim 1, wherein:
the second receiving portion further comprises at least one second backplane located between the first receiving portion and the plurality of mounting plates; and
the at least one second backplane is coupled to the second plurality of hard disks.

3. The chassis of claim 1, wherein:
the receiving member further comprises at least one fixing member for fixedly coupling the first receiving portion and the second receiving portion.

4. The chassis of claim 1, wherein:
the sliding assembly comprises a first sliding member, a second sliding member, and a third sliding member;
the first sliding member is fixed to the bracket;
the second sliding member is slidably engaged with the first sliding member; and the third sliding member is slidably engaged with the second sliding member and coupled to the receiving member.

5. A server comprising: a chassis; a hard disk assembly provided in the chassis; a fan assembly provided in the chassis; and a power supply assembly provided in the chassis, the chassis comprising: a receiving member; a bracket configured to be mounted in a cabinet; and a sliding assembly configured to slidably mount the receiving member on the bracket; and the receiving member comprises a main portion, a first receiving portion, and a second receiving portion; the first receiving portion and the second receiving portion are stacked in the main portion; and each of the first receiving portion and the second receiving portion is configured to receive a corresponding plurality of hard disks; and the main portion comprises a base and a cover; the cover is covered on the base; the base comprises a first bottom plate and two first side plates respectively arranged on opposite sides of the first bottom plate; and the first receiving portion is slidably received in the main portion with the power supply assembly in front; the first receiving portion comprises a second bottom plate and a plurality of second side plates arranged on the second bottom plate; a plurality of first backplanes is arranged at intervals in the first receiving portion; each of the plurality of first backplanes mounts a first plurality of hard disks; and the second receiving portion is located above the first receiving portion; and each of the first side plates defines a sliding groove protruded outward; each of the second side plates comprises a protruding portion; and the protruding portions are respectively slidably received in the sliding grooves for limiting a sliding direction of the first receiving portion; and the second receiving portion comprises four fixing plates and a plurality of mounting plates; the four fixing plates are coupled together end-to-end to cooperatively form a frame structure open at two ends adjacent to the fan assembly; the plurality of mounting plates is arranged at intervals in the frame structure; and the plurality of mounting plates mounts a second plurality of hard disks.

6. The server of claim 5, wherein:
the second receiving portion further comprises at least one second backplane located between the first receiving portion and the plurality of mounting plates; and
the at least one second backplane is coupled to the second plurality of hard disks.

7. The server of claim 6, wherein:
the receiving member further comprises at least one fixing member for fixedly coupling the first receiving portion and the second receiving portion.

8. The server of claim 7, wherein:
the sliding assembly comprises a first sliding member, a second sliding member, and a third sliding member;
the first sliding member is fixed to the bracket;
the second sliding member is slidably engaged with the first sliding member; and
the third sliding member is slidably engaged with the second sliding member and coupled to the receiving member.

* * * * *